United States Patent
Hardikar

(10) Patent No.: US 7,468,322 B1
(45) Date of Patent: Dec. 23, 2008

(54) METHODS OF MULTI-STEP ELECTROCHEMICAL MECHANICAL PLANARIZATION OF CU

(75) Inventor: Vishwas Hardikar, Tempe, AZ (US)

(73) Assignee: Novellus Systems, Inc., San Jose, CA (US)

( * ) Notice: Subject to any disclaimer, the term of this patent is extended or adjusted under 35 U.S.C. 154(b) by 241 days.

(21) Appl. No.: 11/115,520

(22) Filed: Apr. 26, 2005

(51) Int. Cl.
*H01L 21/302* (2006.01)

(52) U.S. Cl. .......................................... 438/690; 216/38

(58) Field of Classification Search .................. 438/690
See application file for complete search history.

(56) References Cited

U.S. PATENT DOCUMENTS

| | | | |
|---|---|---|---|
| 6,653,226 B1 * | 11/2003 | Reid | 438/631 |
| 6,811,680 B2 * | 11/2004 | Chen et al. | 205/662 |
| 6,858,531 B1 | 2/2005 | Zhu et al. | |
| 6,951,599 B2 * | 10/2005 | Yahalom et al. | 204/230.2 |
| 7,160,432 B2 * | 1/2007 | Liu et al. | 205/647 |
| 2004/0072445 A1 | 4/2004 | Sun et al. | |
| 2004/0182721 A1 * | 9/2004 | Manens et al. | 205/645 |

* cited by examiner

*Primary Examiner*—Binh X Tran
*Assistant Examiner*—Patricia A George
(74) *Attorney, Agent, or Firm*—Ingrassia Fisher & Lorenz, P.C.

(57) ABSTRACT

A method is provided for removing conductive material from a metal layer deposited on a wafer having die level thickness variations on its surface. The method includes contacting the metal layer with a composition capable of planarizing die level thickness variations while using a current having a current density within a range of between about 5 mA/cm$^2$ and about 40 mA/cm$^2$, applying a first current to the wafer having a current density within a range of between about 5 mA/cm$^2$ and about 20 mA/cm$^2$ to remove a first portion of the metal layer to thereby planarize the wafer surface, and administering a second current to the wafer having a current density within a range of between about 20 mA/cm$^2$ and about 40 mA/cm$^2$ to remove a second portion of the metal layer and to leave a third portion of the metal layer on the wafer having a predetermined thickness.

31 Claims, 2 Drawing Sheets

100

METHODS OF MULTI-STEP ELECTROCHEMICAL MECHANICAL PLANARIZATION OF CU

FIELD OF THE INVENTION

The present invention generally relates to semiconductor fabrication, and more particularly relates to methods for applying electrochemical mechanical planarization to planarize a semiconductor wafer having varying die level topographies.

BACKGROUND OF THE INVENTION

As technology advances, the demand for smaller and faster microelectronic devices increases as well. To meet these demands, electronic components, such as integrated chips ("ICs"), are being implemented into more and more devices. ICs, which are typically constructed from semiconductor wafers, include metallic layers deposited thereon that make up conductive features. The conductive features allow electronic signals to migrate across the IC at high speeds.

To produce high quality ICs, the surface of the semiconductor wafers, with or without portion of IC's formed thereon, needs to be substantially planar. At some point during the manufacturing process of the IC, however, such as during the formation of the conductive features, the semiconductor wafer may include varying high and low topographies. Thus, the semiconductor wafer surface may need to be polished to thereby create a uniform thickness and desired smoothness across the surface of the wafer.

Typically, chemical mechanical planarization ("CMP") is used to polish a semiconductor wafer. CMP is performed using a CMP assembly that contacts a polishing surface to a wafer and moving the two relative to one another. Polishing fluid may be introduced onto the polishing surface while the wafer and/or polishing surface are in contact. The above combination of chemical and mechanical stresses results in removal of material from the semiconductor wafer.

Although CMP is generally a reliable technique to planarize the wafer, it may not be an appropriate process to employ in all circumstances. For instance, recently copper has been used to form the conductive features in semiconductor wafers. Although copper has more advantageous properties than previously used materials, such as, for example, less susceptibility to electromigration and exhibition of lower resistivity, it is a relatively soft metal. Consequently, a conventional CMP process may stress the wafer, leading to subsequent cracking and shorting between metal layers. Furthermore, the CMP process may result in sheering or crushing of fragile layers, such as for example low dielectric constant material layers. The CMP process also has a tendency to cause dishing in the center of wide metal features, such as trenches and vias, oxide erosion between metal features, and dielectric oxide loss.

As an alternative to CMP, electrochemical planarization has been used for planarizing copper. Electrochemical planarization involves the removal of a thin layer of metal from a wafer through the action of an electrolyte solution and electricity. For example, if two electrodes (an anode and a cathode) are immersed in an electrolyte and are connected to permit a potential difference therebetween, metal atoms in the anode are ionized by the electricity and go into the solution as ions. Depending on the chemistry of the metals and salt, the metal ions from the anode tend to either plate the cathodes, fall out as precipitate, or remain in solution. In some circumstances, a polishing surface, such as, for example, a polishing pad, may be used in conjunction with an electrochemical planarization process to remove additional material from the wafer and increase the rate of removal of the material. In such case, the process is referred to as electrochemical mechanical planarization, or ECMP.

Although ECMP is useful for planarizing copper, conventional ECMP processes may not be as effective in certain circumstances. For example, when a wafer includes both high and low topographies, an ECMP process using single step high currents selectively removes material from field areas adjacent to low topographies of the wafer such as wide metal lines leaving field areas adjacent to high topographies of the wafer such as dense metal arrays. As a result, the wafer may not be entirely planarized, which may prevent the construction of reliable semiconductor junctions and cause subsequent photolithographic processing to result in poor optical resolution. Moreover, high-density features may not be adequately printed on the wafer. Additionally, if a step height of the deposited material is too large, open circuits may be created thereby compromising the quality of the resulting IC.

Accordingly, it is desirable to have a method that overcomes problems related to planarizing wafer surfaces having varying surface topographies. Additionally, it is desirable for the method to produce high quality ICs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
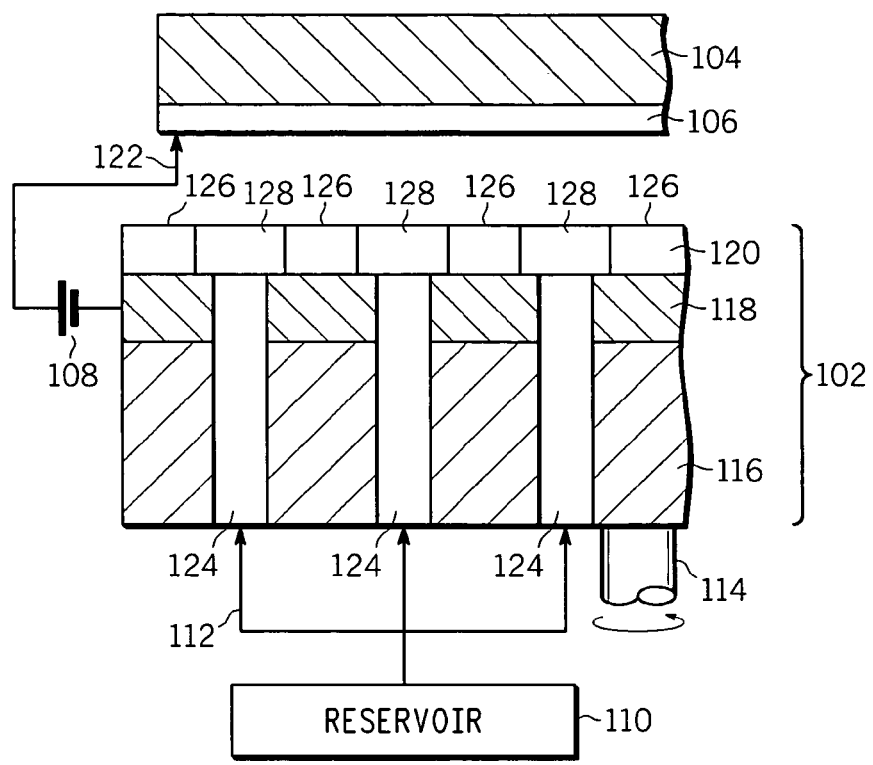
FIG. 1 is a cross-sectional view of an electrochemical planarization apparatus in accordance with an exemplary embodiment of the present invention.

Turning now to FIG. 1, an electrochemical planarization apparatus 100 utilized in accordance with one exemplary embodiment of the present invention is schematically illustrated. As used herein, "electrochemical planarization" includes electrochemical planarization, electrochemical mechanical planarization, electrochemical polishing, and electrochemical mechanical polishing. Electrochemical planarization apparatus 100 includes a stack 102 and a wafer carrier assembly 104 configured to carry a wafer 106. Electrochemical planarization apparatus 100 further comprises a source of potential 108, a reservoir 110 for receiving and holding an electrochemical planarization composition, and a drive controller 114.

Stack 102 comprises a support member or platen 116, a conductive member 118 overlying platen 116, and a wafer contact surface 120 overlying the conductive member 118. Platen 116 may be fabricated from any suitable non-compressible material, such as, for example, a ceramic or stainless steel. Conductive member 118 may be fabricated from a conductive material, such as copper, tantalum, gold or platinum, or may be formed of an inexpensive material, such as aluminum, and coated with a conductive material.

Wafer contact surface 120 may be suitably formed of an insulating material such as a polymeric material, a polymeric/inorganic composite "fixed abrasive" material, or a ceramic insulator material as are used in chemical mechanical polishing of conductive films. Blown polyurethane pads, such as the IC and GS series of pads available from Rodel Products Corporation of Scottsdale, Ariz., may be advantageously used. Preferably, the pads have a hardness in a range of between about 40 Shore A to about 60 Shore D. The pads may have the added benefit of being capable of polishing wafer 106 in a chemical mechanical polishing step, although it will be appreciated that any suitable polishing pad or surface may be used in accordance with the present invention. If wafer contact surface 120 is of an insulative type, it may comprise one or more orifices 128, which may or may not be coaxial with channels 124 described in more detail below, so that wafer 106 may experience an electric potential.

Alternatively, wafer contact surface 120 may be formed of a material that is relatively volume incompressible under an applied pressure load. Volume compressibility can be defined in terms of the bulk modulus, or hydrostatic modulus of the material, and represents the change in volume that occurs in a material under hydrostatic loading, i.e. with pressure applied from all sides. The higher the compressibility of a material, the greater the volume change under an applied pressure load. Preferably the bulk modulus, or compressibility, of surface 120 is greater than about 50,000 pounds per square inch (psi) under an applied surface pressure of less than 4 psi, and greater than about 70,000 psi under an applied surface pressure of less than 2 psi. Suitable materials with the above properties include non-porous polymers such as, for example, molded polytetrafluoroethylene (PTFE), available from DuPont under the trade name Teflon®. This material is also highly inert (i.e. chemically resistant), and its hardness is comparable to polyurethane polishing pads of the type referred to above typical for chemical-mechanical polishing of wafers. Other suitable materials from which wafer contact surface 120 may be manufactured include polyether ether ketone, acetyl homopolymer, polyethylene terephthalate, polyphenol sulfide, and polyvinyl chloride.

Wafer carrier assembly 104 is configured to carry wafer 106 by any method known in the industry, such as, for example, vacuum suction or suitable wafer grippers and to urge wafer 106 against wafer contact surface 120. It will be appreciated that, alternatively, wafer contact surface 120 may be urged against wafer 106 by drive controller 114. Preferably, wafer 106 experiences a uniform and constant pressure of approximately one pound per square inch (psi) or less, although it may be appreciated that any suitable pressure that promotes substantially planar removal of material may be used.

Figure 2:
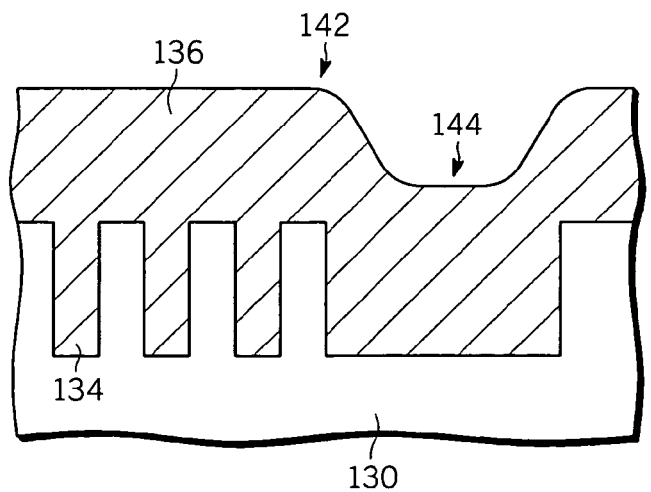
FIG. 2 is a cross-sectional view of an exemplary semiconductor wafer that may be processed using the electrochemical planarization apparatus depicted in FIG. 1.

Wafer 106 may be any one of numerous types of suitable semiconductor wafers having high and low topographies. In one exemplary embodiment, as shown in FIG. 2, wafer 106 comprises a base material layer 130, a conductive metal layer 134 overlying base layer 130, and a bulk layer 136 overlying conductive metal layer 134. Each of these layers 130, 134, and 136 may be constructed of any conventionally used material. For example, base layer 130 may include a dielectric constant material layer, an anti-reflective coating material layer that overlies the dielectric constant material layer, and diffusion barrier material layer overlying the anti-reflective coating material layer. In another example, bulk layer 136 may comprise any metal, such as copper, copper alloys, and the like. Bulk layer 136 may have a non-planar surface 140, as depicted in FIG. 2, and may include a high topography 142 and a low topography 144. Additionally, bulk layer 136 may be formed of the same material that forms conductive metal layer 134 or may be formed of a different material.

Returning to FIG. 1, using source of potential 108, electrochemical planarization apparatus 100 applies a positive potential to wafer 106 through an anode contact 122 to allow wafer 106 to act as an anode, and a negative potential to conductive member 118, which acts as a cathode. Contact 122 may comprise one or more contacts and may contact wafer 106 by a variety of methods. For example, contact 122 may be insulated from and disposed within platen 116, conducting member 118, and wafer contact surface 120 to contact a face of wafer 106, or may be disposed remote from stack 102 to contact the face of wafer 106 at its peripheral edge. Source of potential 108 may apply a constant current or voltage to the apparatus or, alternatively, the current or voltage could be modulated to apply different currents or voltages at predetermined times in the process or to modulate between a predetermined current or voltage and no current or no voltage.

Platen 116 is connected to drive controller 114 that is operative to rotate stack 102 about a vertical axis. It will be appreciated by those of skill in the art, however, that drive controller 114 may be operative to alternatively or simultaneously move stack 102 in an orbital, linear or oscillatory pattern, or any combination thereof. Similarly, wafer carrier assembly 104 may be connected to drive controller 114 or other motor assembly (not shown) that is operative to rotate wafer carrier assembly 104 and wafer 106 about a vertical axis or to move wafer carrier assembly 104 and the wafer 106 in an orbital, linear or oscillatory pattern or any combination thereof.

Platen 116 and conducting member 118 may have one or more channels 124 for the transportation of the electrochemical planarization composition 112 to wafer contact surface 120 from reservoir 110 via a manifold apparatus (not shown) or any suitable distribution system. In one embodiment of the invention, wafer contact surface 120 also has channels 128 that are coaxial with channels 124 and that permit the flow of the electrochemical planarization composition 112 to wafer 106 before and/or during an electrochemical mechanical planarization process. In another embodiment of the invention, channels 124 transport the electrochemical planarization composition 112 to wafer contact surface 120 that absorbs the composition 112 and allows it to flow through the pores to a surface 126 of the wafer contact surface for contact with wafer 106. Alternatively, it will be appreciated that the electrochemical planarization composition 112 may be deposited directly onto or through wafer contact surface 120 by a conduit or any suitable application mechanism.

Figure 3:
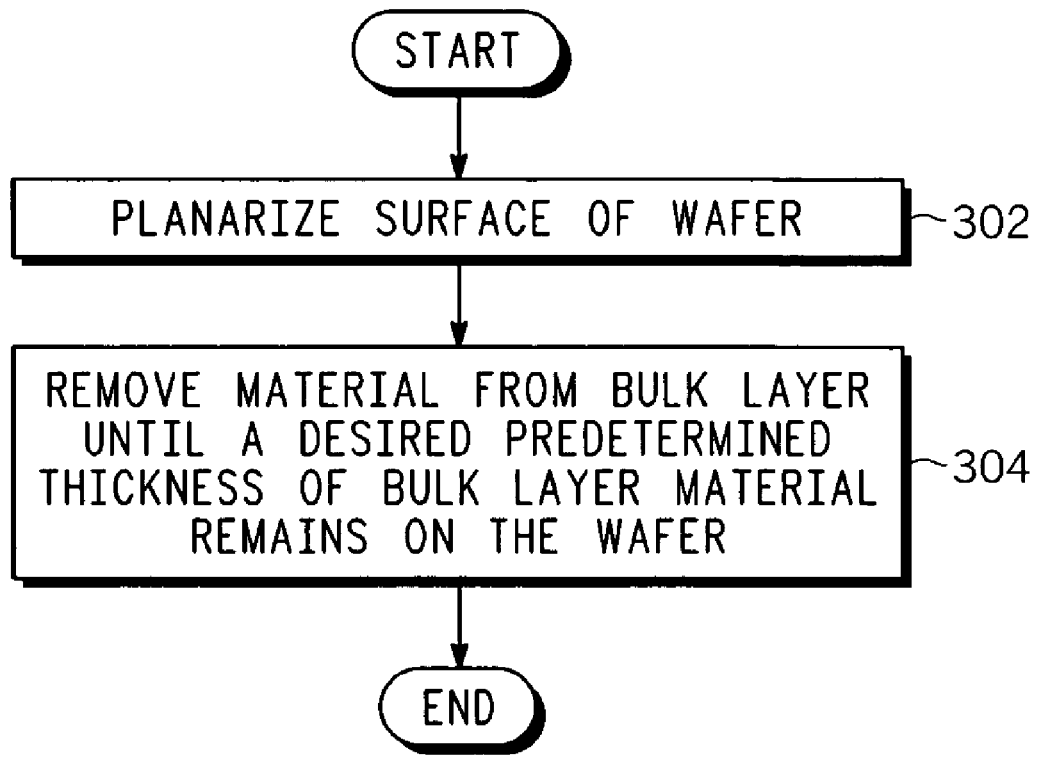
FIG. 3 is a flow diagram of an exemplary method for utilizing the electrochemical planarization apparatus depicted in FIG. 1.

With reference now to FIG. 3, an exemplary method 300 for using the electrochemical planarization apparatus 100 to planarize wafer 106 will now be described. First, the surface of wafer 106 is planarized, step 302. Then, material is removed from bulk layer 136 until a desired predetermined thickness of bulk layer material remains on wafer 106, step 304.

The step of planarizing the surface of wafer 106, step 302, may further include the steps of selecting an electrochemical planarization composition, contacting wafer 106 to the selected electrochemical planarization composition, and applying a first current to wafer 106. It will be appreciated that these steps may occur in any sequence. For example, the first current may be supplied between the wafer 106 and a cathode and electrochemical planarization composition may be subsequently contacted to wafer 106, so that the current flow through wafer 106 once the composition contacts wafer 106 for an "active entry". Alternatively, first, the wafer 106 and the cathode may be contacted with the electrochemical planarization composition, and then an electric potential between the anode and cathode may be provided for a "passive entry".

Preferably, the electrochemical planarization composition is selected for being capable of removing material from bulk layer 136 at a rate of between about 800 nm/min. and about 1000 nm/min., having a planarization efficiency of greater than about 90%, and being capable of planarizing high and low topographies on wafer 106 when a current within a range of between about 3 Amp and about 12 Amp is applied thereto. One exemplary embodiment of the electrochemical planarization composition includes one or more pH and ionic strength adjusting agents, one or more suitable complexing agents, a corrosion inhibitor, and abrasive particles.

The pH and ionic strength adjusting agent is preferably a polyprotic phosphate salt. Suitable pH and ionic strength adjusting agents include, but are not limited to potassium dihydrogen phosphate. The dihydrogen phosphate may be present in a range of between 6% by weight to about 30% by weight, preferably between about 6.8% by weight and about 14% by weight, and most preferably about 6.8% by weight.

The complexing agent is preferably capable of complexing with copper in a pH range of between about pH 1 to about pH 5 and has a standard reduction potential of at least 0.3 V. Suitable complexing agents having the previously-mentioned preferred characteristics include, but are not limited to amines, such as triethylenetetramine and the like. The complexing agent may be present in the electrochemical mechanical planarization composition in any suitable concentration. In one embodiment of the invention, the complexing agent may be present in a range of between about 0.01% to about 10% by weight, preferably between about 0.1% to about 4% by weight.

In another exemplary embodiment, the electrochemical planarization composition includes a corrosion inhibitor. The corrosion inhibitor reduces corrosion of select portions of bulk layer 136 by adsorbing thereon and is used to prevent removal or etching of bulk layer 136 in certain areas. The corrosion inhibitor may be included in any appropriate concentration. In one exemplary embodiment, the electrochemical planarization composition includes between about 0.25% to about 0.3% by weight of the corrosion inhibitor; however, it will be appreciated that the particular concentration may depend on the particular corrosion inhibitor used. Any one of numerous conventionally used corrosion inhibitors may be used, including but not limited to diazoles such as imidazoles, triazoles such as benzotriazole ("BTA") and 1,2,4-triazole, tetrazoles such as 5-aminotetrazole, alkyl, alkylphenyl, amino, or halo derivatives thereof, gallic acid, cathechol, or resorcinol.

In still another exemplary embodiment of the present invention, the electrochemical planarization composition also includes abrasive particles. The abrasive particles operate to uniformly remove material from bulk layer 136. In this regard, the abrasives particles preferably have a Mohs hardness in the range of about 5 to about 9, preferably in the range of about 6 to about 7, and an average particle size in the range of about 20 nm to about 2 microns. The planarization composition of the present invention may comprise abrasive particles such as, for example, silica (Mohs hardness of approximately 6.5), titania (Mohs hardness of approximately 5.5 to 6.5), zirconia (Mohs hardness of approximately 6.5), alumina (Mohs hardness of approximately 9) or a combination thereof. In a preferred embodiment of the invention, the abrasive particles may be formed of silica.

The concentration of the abrasive particles may be in a range of between about 0.1% to about 30%, by weight; however, it will be appreciated that the concentration of abrasive particles used can be adjusted according to a desired rate at which bulk layer 136 material is to be removed. For example, in a process in which the desired removal rate is 500 nm/min., about 0.3% by weight of abrasive particles is preferably used. In a process in which the desired removal rate is 750 nm/min., about 0.6% by weight of abrasive particles is preferably used. Additionally, in a process in which the desired removal rate is 1000 nm/min., between about 0.9% and about 1.2% by weight of abrasive particles is preferably used.

Optionally, the electrochemical planarization composition also may contain other components, an accelerator, a surfactant, and/or an alcohol.

Wafer 106 may be exposed to electrochemical planarization composition in any one of numerous conventional manners. In one exemplary embodiment, wafer 106 is carried by wafer carrier assembly 104 and electrochemical planarization composition is transported from reservoir 110 to wafer contact surface 120 via a manifold apparatus (not shown) and out through channels 124. In another exemplary embodiment, electrochemical planarization composition may be deposited directly onto or through wafer contact surface 120 by a conduit or any suitable application mechanism.

The first current may be supplied to wafer 106 in any one of numerous conventional manners, such as, for example, by using source of potential 108 to apply a positive potential to wafer 106 through anode contact 122, and a negative potential to conductive member 118. The first current may be applied to wafer 106 at a current density preferably in a range of between about 5 mA/cm$^2$ to about 20 mA/cm$^2$, more preferably in a range of between about 10 mA/cm$^2$ to about 15 mA/cm$^2$, and most preferably at 10 mA/cm$^2$. Preferably, the first current is supplied to wafer 106 for an amount of time suitable to remove a first portion of bulk layer 136 to thereby planarize wafer 106. In one exemplary embodiment, the first current is supplied for between about 10 and about 120 seconds. In another exemplary embodiment, the first current is supplied for about 90 seconds.

Step 302 may optionally include steps after the first current is supplied to wafer 106 in which one or more additional currents are supplied. Application of the additional currents may be preferable when the first current is applied to wafer 106 at a relatively low current density, such as, for example, between about 10 mA/cm$^2$ to about 15 mA/cm$^2$ and for a duration of less than about 60 seconds. The use of the relatively low current density and short duration may cause removal and planarization of a small portion of wafer 106, and the additional currents may be used to remove and planarize additional portions of wafer 106.

In one example, step 302 may employ a two current process. In one embodiment, the first current may be applied to wafer 106 at a current density of about 10 mA/cm$^2$ for about 60 seconds and one additional current may be supplied to wafer 106 at a current density of about 15 mA/cm$^2$ for about 20 seconds. In another embodiment, the first current may be applied to wafer 106 at a current density of about 15 mA/cm$^2$ for about 30 seconds and the additional current may be applied to wafer 106 at a current density of about 20 mA/cm$^2$ for about 22 seconds.

In another example, step 302 may employ a three current process. In one embodiment, the first current may be applied to wafer 106 at a current density of about 10 mA/cm$^2$ for about 15 seconds, a first additional current may be supplied to wafer 106 at a current density of about 15 mA/cm$^2$ for about 30 seconds, and a second additional current may be supplied to wafer 106 at a current density of about 20 mA/cm² for about 15 seconds. In another embodiment, the first current may be applied to wafer 106 at a current density of about 10 mA/cm² for about 10 seconds, the first additional current may be supplied to wafer 106 at a current density of about 15 mA/cm² for about 20 seconds, and the second additional current may be supplied to wafer 106 at a current density of about 20 mA/cm² for about 25 seconds.

After step 302, a portion of bulk layer 136 is removed until a desired predetermined thickness remains on wafer 106, step 304. Step 304 may include the steps of moving wafer 106 and wafer contact surface 120 relative to one another, and administering a second current to wafer 106. Preferably, each of these steps is performed while wafer 106 is contacted with the electrochemical planarization composition. Wafer 106 and/or wafer contact surface 120 may be moved in any one of numerous conventional manners, including, but not limited to, rotationally, orbitally, linearly. During relative movement, wafer contact surface 120 may be contacted to wafer 106 using a force of less than about 1 psi and more preferably at a force of less than about 0.3 psi.

The second current is administered to wafer 106 to remove a second portion of bulk layer 136 so that a desired predetermined thickness of bulk layer material remains on wafer 106. The second current may be supplied to wafer 106 in any one of numerous conventional manners, such as, for example, by any manner similar to that employed in step 302. The second current preferably is in a range of between about 20 mA/cm² to about 40 mA/cm², more preferably in a range of between about 30 mA/cm² to about 40 mA/cm², and most preferably at 30 mA/cm². The second current may be supplied to wafer 106 for any amount of time suitable for removing the second portion of bulk layer 136. In one exemplary embodiment, the second current may be supplied to wafer 106 for between about 15 to about 40 seconds. In another exemplary embodiment, the second current is supplied for about 32 seconds.

The following example demonstrates the effectiveness of the various embodiments of the planarizing method of the present invention on the removal of copper from a semiconductor wafer using multiple steps. This example should not be construed as in any way limiting the scope of the present invention.

In one example, a semiconductor wafer was subjected to ECMP using a XCEDA CMP apparatus from Novellus Systems, Inc. while exposed to the electrochemical planarization composition. The wafer comprised 1,150 nm of bulk copper deposited over a 25 nm of Ta/TaN on a 200 mm Sematech 854 Coral™ pattern substrate from Sematech, and the wafer had a surface that included high and low topographies. The electrochemical planarization composition comprised, by weight, about 10% phosphoric acid, about 2% citric acid, about 1.33% triethylenetetramine, about 0.3% benzotriazole, and between about 0.3-1.2% 80 nm abrasive silica particles and the pH of the composition was adjusted to pH 4. The platen and polishing pad of the CMP apparatus were moved orbitally at speeds of between about 400 rpm, with a flow of the electrochemical planarization composition at the polishing pad of 150 ml/min. A stacked pad constructed from an IC 1000 polishing pad over a SubaIV sub-pad available from Rodel, Inc. having a hardness of 54 was used in the CMP apparatus. The wafer was rotated at a velocity of about 5 rpm and a down force pressure of about 0.3 psi was used. The wafer was subjected to two CMP process steps. During the first step, a continuous current density of about 10 mA/cm² was applied to the wafer for a duration of about 90 seconds. As a result, the surface of the wafer 106 had at least a 95% planarization of the high and low topographies. During the second step, a continuous current density of about 30 mA/cm² was applied to the wafer for a duration of about 32 seconds. As a result, the wafer had a bulk layer having a thickness of about 200 nm and a planar surface.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of using an electrochemical planarization composition for removing material from a wafer having an exposed bulk layer and a surface, the method comprising:

applying a first current to the wafer at a current density within a range of between about 5 mA/cm² and about 20 mA/cm² for a time duration suitable to remove a first portion of the bulk layer to thereby planarize the wafer surface; and after the step of applying, administering a second current to the wafer at a current density within a range of between about 20 mA/cm² and about 40 mA/cm² to the wafer for a time duration suitable to remove a second portion of the bulk layer so that a third portion of the bulk layer having a predetermined thickness remains, wherein the second current is greater than the first current;

wherein the electrochemical planarization composition is formulated to planarize a high topography and a low topography of the wafer while a current is supplied to the wafer at a current density within a range of between about 5 mA/cm² and about 40 mA/cm².

2. The method of claim 1, wherein the step of applying the first current further comprises:

supplying the first current between an anode and a cathode; and performing the step of exposing the electrochemical planarization composition to the wafer, after the step of supplying the first current.

3. The method of claim 2, wherein the wafer is the anode.

4. The method of claim 1, wherein:

the step of contacting the first current further comprises contacting the wafer and a cathode with the electrochemical planarization composition; and the step of applying the first current is performed after the step of contacting and comprises providing an electric potential between the wafer and the cathode.

5. The method of claim 1, wherein the step of applying a first current includes applying the first current to the wafer for a duration of between about 10 and about 120 seconds.

6. The method of claim 5, wherein the step of applying a first current includes applying the first current to the wafer for a duration of about 90 seconds.

7. The method of claim 5, wherein the step of applying a first current further comprises applying a current density of about 10 mA/cm² to the wafer.

8. The method of claim 1, wherein the step of applying a first current further comprises applying at least one additional current to the wafer.

9. The method of claim 8, wherein a first additional current is supplied to the wafer in a current density range of between about 15 mA/cm² and about 20 mA/cm².

10. The method of claim 9, wherein the first additional current is supplied to the wafer for a duration of between about 20 seconds and about 30 seconds.

11. The method of claim 8, wherein a second additional current is supplied to the wafer in a current density range of about 20 mA/cm$^2$.

12. The method of claim 11, wherein the second additional current is supplied to the wafer for a duration of between about 15 seconds and about 25 seconds.

13. The method of claim 1, wherein the step of administering a second current includes administering the second current to the wafer for a duration of between about 15 seconds and about 40 seconds.

14. The method of claim 13, wherein the step of administering a second current density includes administering the second current density for a duration of about 32 seconds.

15. The method of claim 14, wherein the step of administering a second current further comprises administering a current density of about 30 mA/cm$^2$ to the wafer.

16. The method of claim 1, wherein the bulk layer comprises copper and the step of contacting the wafer to an electrochemical planarization composition comprises contacting the wafer to a composition comprising a complexing agent capable of complexing with copper at a pH in a range of between about pH 1 to about pH 5 and having a standard reduction potential of at least about 0.3 V, a corrosion inhibitor, abrasive particles, and a pH and ionic strength adjuster.

17. The method of claim 16, wherein the step of contacting the wafer to an electrochemical planarization composition further comprises contacting the wafer to a composition comprising about 1.33% by weight of triethylenetetramine, between about 6% by weight to about 30% by weight of potassium dihydrogen phosphate, about 0.3% by weight of BTA, and between about 0.3% by weight to about 1.2% by weight of 80 nm silica particles.

18. The method of claim 1, further comprising providing relative movement between the wafer and a polishing surface and applying the polishing surface to the wafer at a force of less than about 1 psi.

19. A method of using an electrochemical planarization composition for removing material from a wafer having an exposed bulk layer and a surface, the method comprising:
applying a first current to the wafer at a current density of about 10 mA/cm$^2$ for a time duration suitable to remove a first portion of the bulk layer to thereby planarize the wafer surface; and
after the step of applying, administering a second current to the wafer at a current density of about 30 mA/cm$^2$ for a time duration suitable to remove a second portion of the bulk layer so that a third portion of the bulk layer having a predetermined thickness remains;
wherein the electrochemical planarization composition is formulated to planarize a high topography and a low topography of the wafer while a current is supplied to the wafer at a current density within a range of between about 10 mA/cm$^2$ and about 30 mA/cm$^2$.

20. The method of claim 19, wherein the step of applying the first current further comprises:
supplying the first current between a wafer and a cathode; and
performing the step of exposing the electrochemical planarization composition to the wafer, after the step of supplying the first current.

21. The method of claim 19, wherein:
the step of contacting the first current further comprises contacting the wafer and a cathode with the electrochemical planarization composition; and
the step of applying the first current is performed after the step of contacting and comprises providing an electric potential between the wafer and the cathode.

22. The method of claim 19, wherein the step of applying a first current includes applying the first current to the wafer for a duration of between about 10 and about 120 seconds.

23. The method of claim 22, wherein the step of applying a first current includes applying the first current to the wafer for a duration of about 90 seconds.

24. The method of claim 19, wherein the step of administering a second current includes administering the second current to the wafer for a duration of between about 20 seconds and about 40 seconds.

25. The method of claim 24, wherein the step of administering a second current includes administering the second current for a duration of about 32 seconds.

26. A method of using an electrochemical planarization composition for removing material from a wafer having an exposed bulk layer and a surface, the method comprising:
applying a first current to the wafer at a current density within a range of between about 5 mA/cm$^2$ and about 20 mA/cm$^2$ for a duration suitable to remove a first portion of the bulk layer to thereby planarize the wafer surface; and
after the step of applying, administering a second current to the wafer at a current density within a range of between about 30 mA/cm$^2$ and about 40 mA/cm$^2$ for a duration suitable to remove a second portion of the bulk layer so that a third portion of the bulk layer having a predetermined thickness remains;
wherein the electrochemical planarization composition is formulated to comprise: about 1.33% by weight of triethylenetetramine, between about 6% by weight to about 30% by weight of potassium dihydrogen phosphate, about 0.3% by weight of BTA, and between about 0.3% by weight to about 1.2% by weight of 80 nm silica particles.

27. The method of claim 26, wherein the step of applying the first current further comprises:
supplying the first current between the wafer and a cathode; and
performing the step of exposing the electrochemical planarization composition to the wafer, after the step of supplying the first current.

28. The method of claim 26, wherein:
the step of contacting the first current further comprises contacting the wafer and a cathode with the electrochemical planarization composition; and
the step of applying the first current is performed after the step of contacting and comprises providing an electric potential between the anode and the cathode.

29. The method of claim 26, wherein the step of applying a first current includes applying the first current to the wafer for a duration of between about 10 and about 120 seconds.

30. The method of claim 28, wherein the step of administering a second current includes administering the second current to the wafer for a duration of between about 20 seconds and about 40 seconds.

31. The method of claim 26, further comprising providing relative movement between the wafer and a polishing surface and applying the polishing surface to the wafer at a force of less than about 1 psi.

* * * * *